United States Patent
Lee

(10) Patent No.: US 8,274,032 B2
(45) Date of Patent: Sep. 25, 2012

(54) SEPARATED UNIT PIXEL PREVENTING SENSITIVITY REDUCTION AND THE DRIVING METHOD USING THE UNIT PIXEL

(75) Inventor: Do-Young Lee, Seongnam-si (KR)

(73) Assignee: Siliconfile Technologies Inc., Seoul (KR)

( * ) Notice: Subject to any disclaimer, the term of this patent is extended or adjusted under 35 U.S.C. 154(b) by 410 days.

(21) Appl. No.: 12/670,603

(22) PCT Filed: Aug. 4, 2008

(86) PCT No.: PCT/KR2008/004506
§ 371 (c)(1),
(2), (4) Date: Jan. 25, 2010

(87) PCT Pub. No.: WO2009/020315
PCT Pub. Date: Feb. 12, 2009

(65) Prior Publication Data
US 2010/0213348 A1  Aug. 26, 2010

(30) Foreign Application Priority Data
Aug. 9, 2007  (KR) .................. 10-2007-0080160

(51) Int. Cl.
*H01L 27/00* (2006.01)
(52) U.S. Cl. ..................... 250/208.1; 250/239
(58) Field of Classification Search .......... 250/208.1, 250/214 R, 239; 257/290–292, 233–239, 257/458; 438/73–98, 58, 59, 199
See application file for complete search history.

(56) References Cited

U.S. PATENT DOCUMENTS
6,774,420 B2 *  8/2004  Hayashimoto et al. ....... 257/294
7,253,392 B2     8/2007  Hong et al.
2005/0051702 A1  3/2005  Hong et al.

FOREIGN PATENT DOCUMENTS
KR  10-2003-0044333 A  6/2003
KR  10-2006-027971 A   3/2006
WO  2006/109937 A1    10/2006

OTHER PUBLICATIONS
PCT International Search Report of International Application No. PCT/KR2008/004506.
PCT Written Opinion of the International Search Authority of International Application No. PCT/KR2008/004506.
PCT International Preliminary Report on Patentability of International Application No. PCT/KR2008/004506.

* cited by examiner

*Primary Examiner* — Que T Le
(74) *Attorney, Agent, or Firm* — Kile Park Goekjian Reed & McManus PLLC

(57) ABSTRACT

Provided are a separation type unit pixel for preventing sensitivity reduction to prevent a depletion area from decreasing and a method of driving the unit pixel. The separation type unit pixel for preventing sensitivity reduction includes: a substrate; a photodiode constructed with a junction of a P-type diffusion area and an N-type diffusion area which are formed under a surface of the substrate in a vertical direction; a gate electrode conductor which is disposed on an upper portion of the surface of the substrate to be adjacent to the N-type or P-type diffusion area; a floating diffusion area formed to be adjacent to another surface of the gate electrode conductor; and a sensitivity reduction preventing conductor disposed on an upper portion of the photodiode area to cover the photodiode area.

6 Claims, 3 Drawing Sheets

SEPARATED UNIT PIXEL PREVENTING SENSITIVITY REDUCTION AND THE DRIVING METHOD USING THE UNIT PIXEL

TECHNICAL FIELD

The present invention relates to a separation type unit pixel, and more particularly, to a separation type unit pixel for preventing sensitivity reduction and a method of driving the unit pixel.

BACKGROUND ART

In general, each of unit pixels includes a photodiode for generating charges corresponding to an incident image signal, and an image signal conversion circuit for converting the charges generated by the photodiode into a corresponding electrical signal.

FIG. 1 is a circuit diagram of a unit pixel.

Referring to FIG. 1, the unit pixel includes a photodiode PD, a transfer transistor M1, a reset transistor M2, a conversion transistor M3, and a selection transistor M4. Here, the image signal conversion circuit generally includes the transfer transistor M1 for transferring charges generated by the photodiodes PD in response to a transfer control signal Tx to a floating diffusion area FD, the reset transistor M2 for resetting the floating diffusion area FD in response to a reset control signal Rx, the conversion transistor M3 for generating an electrical signal corresponding to the charges accumulated into the floating diffusion area FD, and the selection transistor M4 for outputting the electrical signal converted by the conversion transistor M3 in response to a selection control signal Sx.

Conventionally, the unit pixels are formed in the same wafer. However, in order to increase an area of the photodiode included in the unit pixel, the unit pixel is divided into two parts so as to be formed in different wafers. As described above, a separation type unit pixel is proposed. The separation type unit pixel is implemented so that pixel chips separated to be formed in two different wafers are electrically connected to be used. In this case, the photodiode and the transfer transistor are formed on a wafer and the remaining transistors excluding the transfer transistor from the transistors included in the image signal conversion circuit are formed on the other wafer.

Referring to FIG. 1, the photodiode PD and the transfer transistor M1 illustrated on the left side with respect to a dotted line may be formed on the wafer, and the remaining reset transistor M2, the conversion transistor M3, and the selection transistor M4 illustrated on the right side may be formed on the other wafer.

FIG. 2 is a cross-sectional view of a unit pixel of separation type unit pixels, on which a photodiode and a transfer transistor are formed.

Referring to FIG. 2, the unit pixel 200 is formed on a P– epilayer 21 formed by performing epitaxial growth on a P++ substrate 20. Here, it means that P++ has higher impurity concentration than P–.

The unit pixels are insulated from each other by shallow trench insulators (STIs) 22. The photodiode is constructed with junctions of N-types 25 and 28 and P-types 28 and 29, respectively to generate charges corresponding to incident light energy. The generated charges are transferred to floating diffusion areas 27 and 30 by transfer transistors operating in response to transfer control signals T/G1 and T/G2 applied to gate terminals 23-1 and 23-2, respectively. Spacers 24 are provided at both sides of the gate areas 23-1 and 23-2.

Since structures and operations of the two unit pixels are the same, hereinafter, only the unit pixel illustrated on the left side is described. The junction of the N area 25 of the photodiode and the P-type epitaxial substrate 21 is a PN junction, and therefore at the PN junction portion at which the two areas 21 and 25 contact with each other, a depletion area (covered by the outside dotted line) having a predetermined width is formed naturally. In general, since the concentration of impurities injected into the N area 25 is greater than the concentration of impurities injected into the P-type epitaxial substrate 21, in a case where any bias is not applied to the PN junction, the depletion area may be extended wider in a direction from the N-type area 25 to the P-type epitaxial substrate 21.

In general, DC bias having a low voltage level is applied to the P-type epitaxial substrate 21. Therefore, due to the DC bias applied to the epitaxial substrate 21, a width of the depletion area and the P-type epitaxial substrate 21 further increases. In the depletion area where charges do not exist, an electric field including a predetermined electric field due to fixed ionized charges and an electric field due to the DC bias exists.

When light having predetermined energy is incident from a lower portion of the conventional unit pixel illustrated in FIG. 2 into the photodiode, the photodiode generates a corresponding electron-hole pair. The electron-hole pairs may be recombined. However, the electron-hole pairs may be moved to the P area 26 or the N area 25 by diffusion and drift.

When the transfer transistor 23-1 is turned off, a voltage profile of the photodiode is illustrated as a dotted contour map. A dotted line circle closest to the center of the contour map has the highest voltage level, and outer dotted line circles have lower voltage levels. Therefore, in correspondence with an image signal (light) incident from a lower portion of the unit pixel, charges generated in the substrate 21 and the photodiode are accumulated into the center portion of concentric circles.

When the transfer transistor 23-1 is turned on, the charges accumulated into the center portion of the concentric circles are transferred to a floating diffusion area along a surface (a two-way arrow illustrated as a thick line) of the transfer transistor 23-1. Here, since the center portion of the concentric circles is far from the surface on which a channel is formed, a path for transferring the charges accumulated into the concentric circles to the floating diffusion area is lengthened. Therefore, there is a problem in that image sensitivity of the unit pixels, that is, sensitivity of the image sensor decreases.

DISCLOSURE OF INVENTION

Technical Problem

The present invention provides a separation type unit pixel for preventing sensitivity reduction by minimizing a charge transfer path for transferring charges generated in correspondence with an incident image signal to a floating diffusion area along a surface of a transfer transistor.

The present invention also provides a method of driving the separation type unit pixel for preventing sensitivity reduction by minimizing a charge transfer path for transferring charges generated in correspondence with an incident image signal to a floating diffusion area along a surface of a transfer transistor.

Technical Solution

According to an aspect of the present invention, there is provided a separation type unit pixel for preventing sensitivity reduction comprising: a substrate; a photodiode constructed with a junction of a P-type diffusion area and an N-type diffusion area which are formed under a surface of the substrate in a vertical direction; a gate electrode conductor which is disposed on an upper portion of the surface of the substrate to be adjacent to the N-type or P-type diffusion area; a floating diffusion area formed to be adjacent to another surface of the gate electrode conductor; and a sensitivity reduction preventing conductor disposed on an upper portion of the photodiode area to cover the photodiode area.

According to another aspect of the present invention, there is provided a method of driving a separation type unit pixel, wherein the separation type unit pixel comprises: a substrate: a photodiode constructed with a junction of a P-type diffusion area and an N-type diffusion area which are formed under a surface of the substrate in a vertical direction; a gate electrode conductor which is disposed on an upper portion of the surface of the substrate to be adjacent to the N-type or P-type diffusion area; a floating diffusion area formed to be adjacent to another surface of the gate electrode conductor; and a sensitivity reduction preventing conductor disposed on an upper portion of the photodiode area to cover the photodiode area, wherein the gate electrode conductor is applied with a transfer control signal, and the sensitivity reduction preventing conductor is applied with a sensitivity reduction preventing signal, and wherein the sensitivity reduction preventing signal is enabled when the transfer control signal is in a disabled state, disabled after the transfer control signal is enabled and a predetermined delay time elapses, and enabled again after the transfer control signal is disabled and a predetermined delay time elapses.

Advantageous Effects

The separation type unit pixel for preventing sensitivity reduction and the method of driving the separation type unit pixel have a minimized charge transfer path for transferring chargers generated in correspondence with an incident image signal to the floating diffusion area along the surface of the transfer transistor, thereby minimizing sensitivity reduction.

BRIEF DESCRIPTION OF THE DRAWINGS

The above and other features and advantages of the present invention will become more apparent by describing in detail exemplary embodiments thereof with reference to the attached drawings in which.

BEST MODE FOR CARRYING OUT THE INVENTION

Exemplary embodiments of the present invention will now be described in detail with reference to the accompanying drawings.

Figure 3:
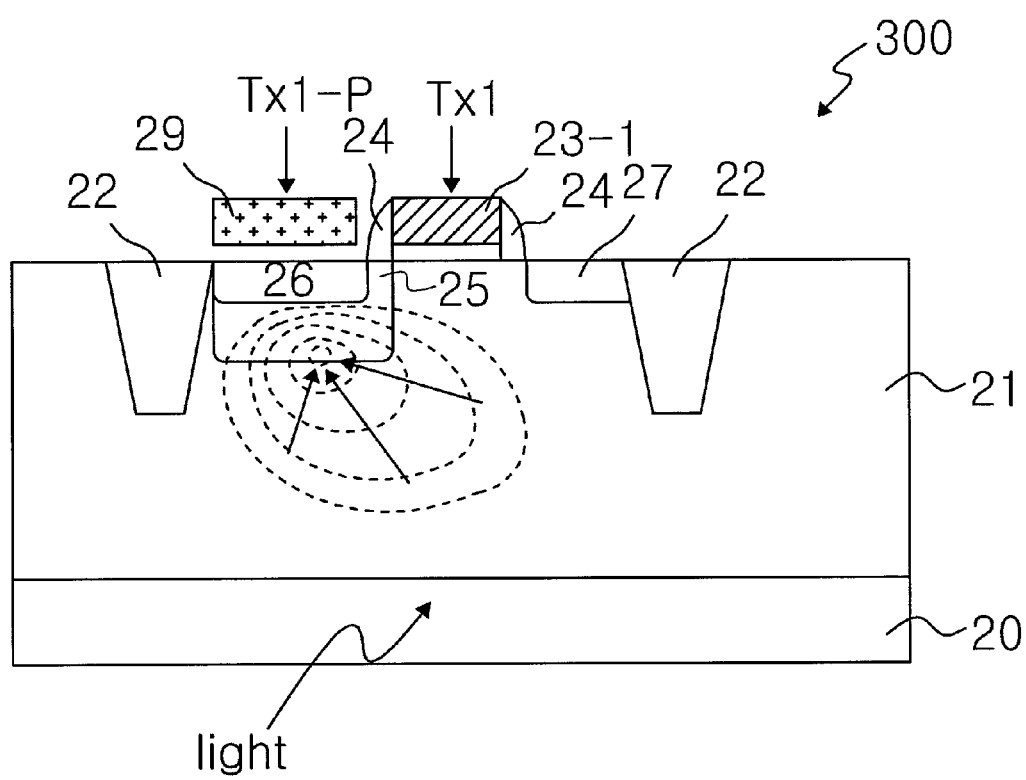
FIG. 3 is a cross-sectional view of a separation type unit pixel for preventing sensitivity reduction according to an embodiment of the present invention.

FIG. 3 is a cross-sectional view of a separation type unit pixel for preventing sensitivity reduction according to an embodiment of the present invention.

Referring to FIG. 3, the separation type unit pixel 300 is formed in an epitaxial substrate 21 formed by performing epitaxial growth on an upper portion of a base substrate 20, is insulated from other unit pixels by a shallow trench insulator (STI) 22, and includes a photodiode and a transfer transistor. Here, as shown in FIG. 3, light is incident from a lower portion of the substrate 20 into the photodiode area 25, 26.

Here, when it is assumed that the epitaxial substrate 21 has a P-type, the photodiode is constructed with a junction of a P-type diffusion area 26 formed at a surface of the substrate and an N-type diffusion area 25 formed under the P-type diffusion area 26. The transfer transistor includes the N-type diffusion area as a terminal, a floating diffusion area 27 as the other terminal, and a gate terminal 23-1 applied with a transfer control signal Tx1. As a material of the gate terminal 23-1 of the transfer transistor, polycrystalline silicon may be used. Upper portions of the photodiodes areas 25 and 26 are covered by a sensitivity reduction preventing conductor 29 applied with a sensitivity reduction preventing signal Tx1-P. As a material of the sensitivity reduction preventing conductor 29, polycrystalline silicon like the gate terminal 23-1 of the transfer transistor or a conductive material such as metal may be used.

The N-type diffusion area 25 of the photodiode is wider than the P-type diffusion area 26 by an area of a spacer 24 of the transfer transistor, and the N-type diffusion area 25 serves as a common terminal of the photodiode and the transfer transistor. This can be easily implemented by forming the N-type diffusion area 25 without the spacer 24 first, forming the spacer 24, and forming the P-type diffusion area 26 into the N-type diffusion area 25. The operations of generating the photodiode having the aforementioned construction are easily understood by those skilled in the semiconductor manufacturing technology, so that a detailed description thereof is omitted.

In addition, although not shown in the figure, an insulating material may be formed between the surface of the epitaxial substrate 21 and the gate terminal 23-1 of the transfer transistor and between the surface of the epitaxial substrate 21 and the sensitivity reduction preventing conductor 29.

Figure 4:
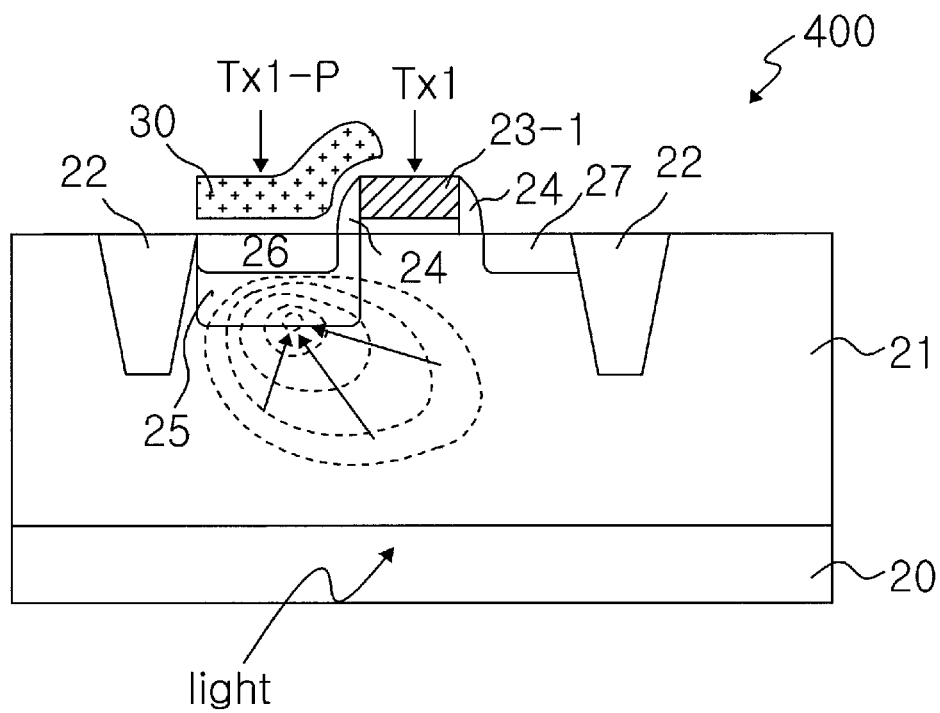
FIG. 4 is a cross-sectional view of a separation type unit pixel for preventing sensitivity reduction according to another embodiment of the present invention.

FIG. 4 is a cross-sectional view of a separation type unit pixel for preventing sensitivity reduction according to another embodiment of the present invention.

Referring to FIG. 4, a sensitivity reduction preventing conductor 30 of the separation type unit pixel 400 is different from the sensitivity reduction preventing conductor 29 of the separation type unit pixel illustrated in FIG. 3 in that the sensitivity reduction preventing conductor 30 covers a portion or the entire portion of an upper portion of the gate terminal 23-1 of the transfer transistor. Here, as shown in FIG. 4, light is incident from a lower portion of the substrate 20 into the photodiode area 25, 26.

Figure 5:
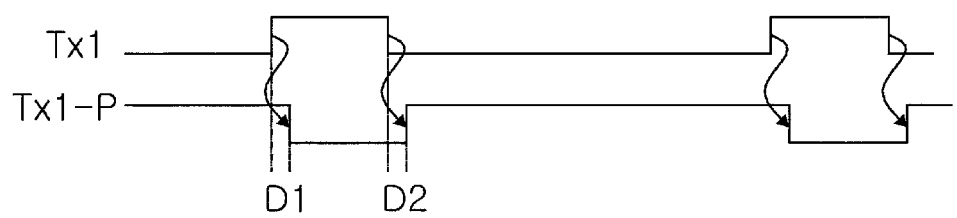
FIG. 5 is a waveform diagram of a signal for driving the separation type unit pixel for preventing sensitivity reduction according to the present invention.

FIG. 5 is a waveform diagram of a signal for driving the separation type unit pixel for preventing sensitivity reduction according to the present invention.

Referring to FIG. 5, in a time period in which a transfer control signal Tx1 is disabled (referred to as logic low), the photodiode receives an image signal and generates charges. Here, a sensitivity reduction preventing signal Tx1-P is enabled (referred to as logic high) to prevent the reduction in the depletion area. In a time period in which the transfer control signal Tx1 is enabled (logic high), the charges generated by the photodiode are transferred to the floating diffusion area 27. Here, after the transfer control signal Tx1 is transited from the disabled state (logic low) to the enabled stage (logic high) and a predetermined time D1 elapses, the sensitivity reduction preventing signal Tx1-P is transited from the enabled (logic high) state to the disabled (logic low) stage. Thereafter, after the transfer control signal Tx1 is transited to the disabled (logic low) state and a predetermined time D2 elapses, the sensitivity reduction preventing signal Tx1-P is transited to the enabled (logic high) state. Here, the predetermined times D1 and D2 are set to optimal times on the basis of experiments or trials or may be set to 0. In some cases, the sensitivity reduction preventing signal Tx1-P may be set to precede the transfer control signal Tx1.

Now, operations and principles of the separation unit pixel for preventing sensitivity reduction according to the present invention are described with reference to FIGS. 3 to 5.

First, the sensitivity reduction preventing signal Tx1-P applied to the sensitivity reduction preventing conductors 29 and 30 has a predetermined voltage level. In the depletion area existing between the N-type diffusion area 25 and the P-type substrate 21, an electric field is formed in a direction from the N-type diffusion area 25 to the P-type substrate 21. For example, when it is assumed that it is a higher voltage power supply of an operating power supply for operating the image sensor, due to the voltage level of the sensitivity reduction preventing signal Tx1-P applied to the sensitivity reduction preventing conductors 29 and 30, the electric field is increased to be stronger and a voltage profile is changed.

Figure 1:
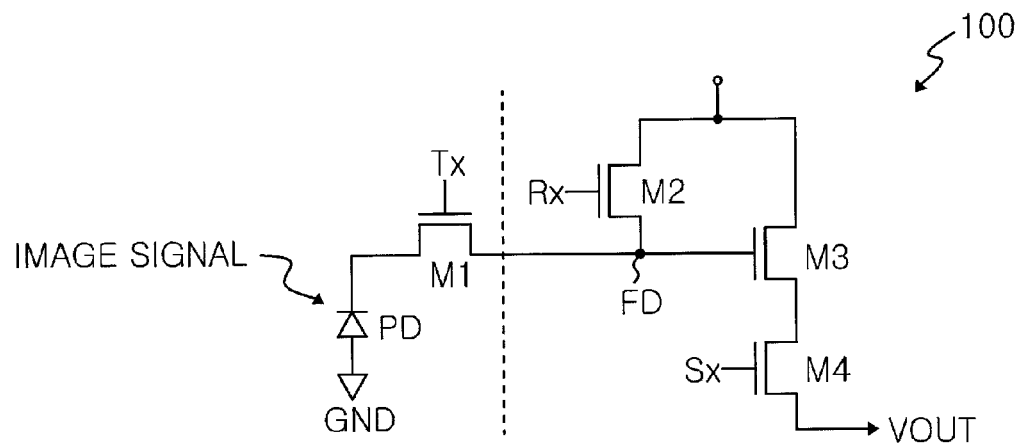
FIG. 1 is a circuit diagram of a unit pixel.
Figure 2:
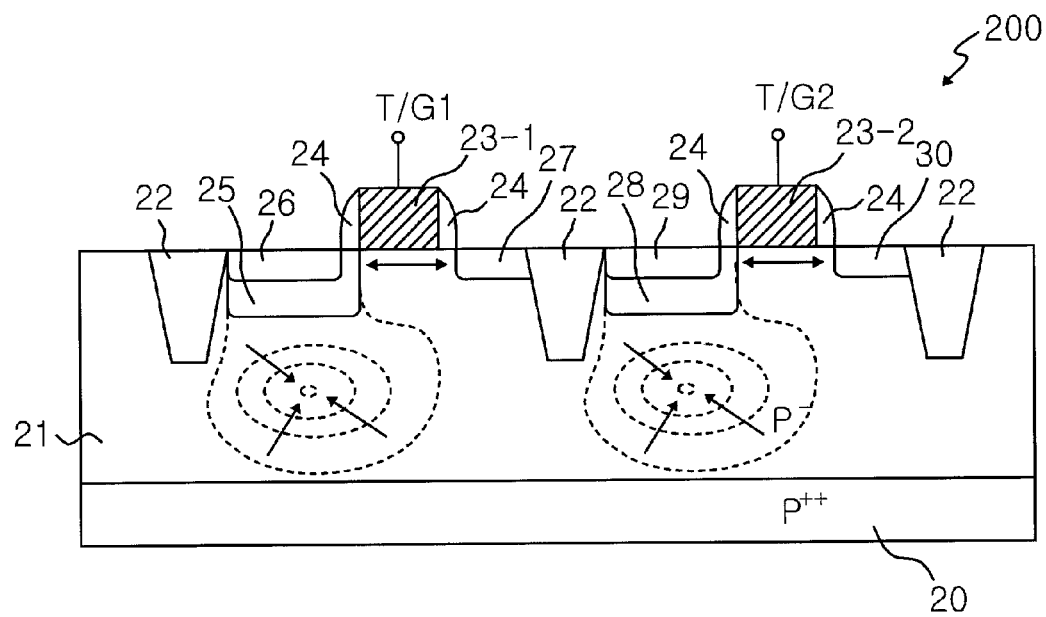
FIG. 2 is a cross-sectional view of a unit pixel of separation type unit pixels, on which a photodiode and a transistor are formed.

Referring to FIGS. 3 and 4, the voltage profile of the photodiode is represented as dotted lines in a case where the sensitivity reduction preventing signal Tx1-P is applied to the sensitivity reduction preventing conductors 29 and 30. A dotted line circle having the highest voltage level is disposed to be closer to the surface of the substrate than a position of a dotted line circle having the highest voltage level illustrated in FIG. 2. In addition, the voltage profile illustrated in FIG. 2 has a shape in that voltages decrease so that voltage differences are relatively uniform in the radial direction of the dotted line circles. On the other hand, the voltage profile illustrated in FIG. 3 has a shape in that voltage differences are rapidly increased in the radial direction toward the surface of the substrate and decreased toward the lower portion of the substrate. Therefore, it can be expected that the charges generated by the substrate or the photodiode tend to move toward the surface of the substrate than the lower portion of the substrate.

Therefore, a distance of the charges accumulated around the surface of the substrate to move to the floating diffusion area along the surface of the substrate can be minimized.

The voltage level of the sensitivity reduction preventing signal Tx1-P can be set to an optical voltage level on the basis of experiments or a series of trials. In a case where positions of the N-type and P-type diffusion areas 25 and 26 are switched, the voltage level of the sensitivity reduction preventing signal Tx1-P is controlled to be opposite to solve the aforementioned problem.

While the present invention has been shown and described in connection with the exemplary embodiments, it will be apparent to those skilled in the art that modifications and variations can be made without departing from the spirit and scope of the invention as defined by the appended claims.

What is claimed is:

1. A separation type unit pixel for preventing sensitivity reduction comprising:
    a substrate;
    a photodiode constructed with a junction of a P-type diffusion area and an N-type diffusion area which are formed under a surface of the substrate in a vertical direction;
    a gate electrode conductor which is disposed on an upper portion of the surface of the substrate to be adjacent to the N-type or P-type diffusion area;
    a floating diffusion area formed to be adjacent to another surface of the gate electrode conductor; and
    a sensitivity reduction preventing conductor disposed on an upper portion of the photodiode area to cover the photodiode area,
    wherein light is incident from a lower portion of the substrate and an epitaxial substrate is disposed on an upper portion of the substrate.

2. The separation type unit pixel of claim 1, wherein the sensitivity reduction preventing conductor further covers a portion of the gate electrode conductor.

3. The separation type unit pixel of claim 1, wherein an insulating material is formed between the surface of the substrate and the gate electrode conductor and between the surface of the substrate and the sensitivity reduction preventing conductor.

4. The separation type unit pixel of claim 1,
    wherein the gate electrode conductor is polycrystalline silicon, and
    wherein the sensitivity reduction preventing conductor is metal or polycrystalline silicon.

5. The separation type unit pixel of claim 1,
    wherein the substrate has a P-type,
    wherein a spacer is formed at a side surface of the gate electrode conductor,
    wherein the P-type diffusion area is formed on the surface of the P-type substrate, and
    wherein the N-type diffusion area is formed under the P-type diffusion area to be wider than the P-type diffusion area by a thickness of the spacer.

6. A method of driving a separation type unit pixel,
    wherein the separation type unit pixel comprises:
    a substrate:
    a photodiode constructed with a junction of a P-type diffusion area and an N-type diffusion area which are formed under a surface of the substrate in a vertical direction;
    a gate electrode conductor which is disposed on an upper portion of the surface of the substrate to be adjacent to the N-type or P-type diffusion area;
    a floating diffusion area formed to be adjacent to another surface of the gate electrode conductor; and
    a sensitivity reduction preventing conductor disposed on an upper portion of the photodiode area to cover the photodiode area,
    wherein the gate electrode conductor is applied with a transfer control signal, and the sensitivity reduction preventing conductor is applied with a sensitivity reduction preventing signal, and
    wherein the sensitivity reduction preventing signal is enabled when the transfer control signal is in a disabled state, disabled after the transfer control signal is enabled and a predetermined delay time elapses, and enabled again after the transfer control signal is disabled and a predetermined delay time elapses, and wherein light is incident from a lower portion of the substrate and an epitaxial substrate is disposed on an upper portion of the substrate.

* * * * *